United States Patent [19]

Nakagawa

[11] Patent Number: 5,412,230
[45] Date of Patent: May 2, 1995

[54] HIGH ELECTRON MOBILITY TRANSISTOR HAVING IMPROVED ELECTRON CONTROLLABILITY

[75] Inventor: Yoshikazu Nakagawa, Kyoto, Japan

[73] Assignee: Rohm Co., Ltd., Kyoto, Japan

[21] Appl. No.: 954,909

[22] Filed: Sep. 30, 1992

[30] Foreign Application Priority Data

Oct. 29, 1991 [JP] Japan ................. 3-311826

[51] Int. Cl.⁶ ......................... H01L 29/812
[52] U.S. Cl. ................. 257/191; 257/190; 257/194
[58] Field of Search ............ 257/191, 194, 190

[56] References Cited

U.S. PATENT DOCUMENTS 5,099,295 3/1992 Ogawa ........................ 257/191
5,206,527 4/1993 Kuwata ....................... 257/191

FOREIGN PATENT DOCUMENTS 0257300 3/1988 European Pat. Off. .
64-014972 1/1989 Japan .
64-031470 2/1989 Japan .
3-224243 10/1991 Japan .

*Primary Examiner*—William D. Larkins
*Attorney, Agent, or Firm*—Brumbaugh, Graves, Donohue & Raymond

[57] ABSTRACT

First and second high-resistivity compound semiconductor channel layers are formed between an undoped compound semiconductor layer and a doped compound semiconductor layer having an electron affinity smaller than the undoped compound semiconductor layer. The first high-resistivity compound semiconductor channel layer is adjacent to the doped compound semiconductor layer, and has an electron affinity distribution that increases toward the undoped compound semiconductor layer. The second high-resistivity compound semiconductor channel layer is located between the first high-resistivity compound semiconductor channel layer and the undoped compound semiconductor layer, and has an electron affinity distribution that decreases toward the undoped compound semiconductor layer. A gate electrode and cap layers are formed on the doped compound semiconductor layer. Source and drain electrodes are formed on the respective cap layers.

2 Claims, 3 Drawing Sheets

HIGH ELECTRON MOBILITY TRANSISTOR HAVING IMPROVED ELECTRON CONTROLLABILITY

BACKGROUND OF THE INVENTION

The present invention relates to compound semiconductor devices such as a HEMT (high electron mobility transistor).

A HEMT structure is now drawing much attention, which is a field-effect transistor utilizing a two-dimensional electron gas accumulated in a heterojunction interface. The HEMT structure is illustrated in FIG. 6. An undoped semiconductor layer 2 is formed on a substrate 1, and a doped semiconductor layer 3 having an electron affinity smaller than the layer 2 is formed on the layer 2. A gate electrode 4 is formed on the doped semiconductor layer 3. A source electrode 6 and a drain electrode 7 are formed on cap layers 5 that are formed on the doped semiconductor layer on both sides of the gate electrode 4.

In this HEMT structure, all the donor impurities added to the smaller electron affinity doped semiconductor layer 3 are ionized, and electrons generated by this ionization are accumulated in the heterojunction interface with the larger electron affinity undoped semiconductor layer 2 to form a two-dimensional electron gas 8. The distribution of the electron gas 8 can be controlled by a voltage applied to the gate electrode 4, to enable control of a current flowing between the source and drain.

FIGS. 7(a) and 7(b) are energy band diagrams showing electron distributions D when no voltage is applied to the gate electrode 4 (FIG. 7(a)), i.e., the device is not in use, and when a certain negative voltage is applied (FIG. 7(b)). As shown in these figures, the distribution D of the two-dimensional electron gas 8 assumes a mountain-like shape having some spread which is larger when the negative voltage is applied to the gate electrode 4. The degree of expansion depends on the magnitude of the negative voltage.

In other words, the center of gravity P of the electron distribution D goes farther away from the heterojunction interface as the negative voltage increases. Particularly in low-noise HEMTs in which a negative voltage is applied to the gate electrode to reduce the current, this phenomenon will deteriorate the electron controllability and make it difficult to realize satisfactory low-noise characteristics.

SUMMARY OF THE INVENTION

The present invention has been made in view of the above problems in the art, and has an object of providing a high electron mobility transistor in which the center of gravity of the above-described electron distribution hardly moves.

According to the invention, a high electron mobility transistor comprises:
undoped compound semiconductor layer;
doped compound semiconductor layer having an electron affinity smaller than the undoped compound semiconductor layer;
a gate electrode and a pair of cap layers formed on the doped compound semiconductor layer;
source and drain electrodes formed on the pair of cap layers, respectively;
a first high-resistivity compound semiconductor channel layer formed adjacent the doped compound semiconductor layer and having an electron affinity distribution that increases toward the undoped compound semiconductor layer; and
a second high-resistivity compound semiconductor channel layer formed between the first high-resistivity compound semiconductor channel layer and the undoped compound semiconductor layer and having an electron affinity distribution that decreases toward the undoped compound semiconductor layer.

DESCRIPTION OF THE PREFERRED EMBODIMENT

Figure 1:
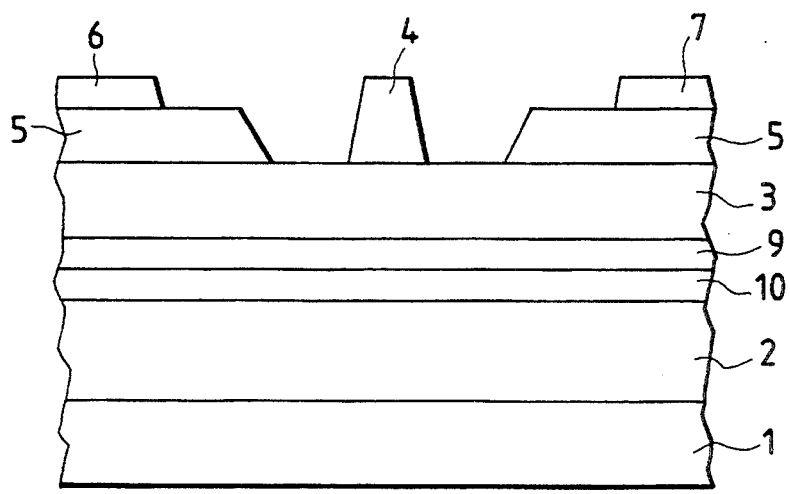
FIG. 1 is a sectional view of a high electron mobility transistor according to an embodiment of the present invention.
Figure 6:
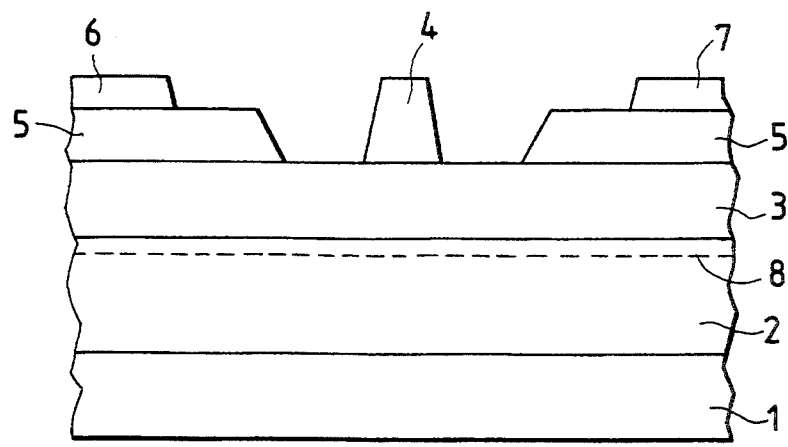
FIG. 6 is a sectional view of a conventional high electron mobility transistor.
Figure 7A:
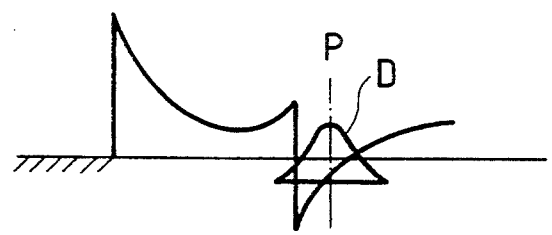
FIGS. 7(a) and 7(b) are energy band diagrams of the conventional high electron mobility transistor.
Figure 7B:
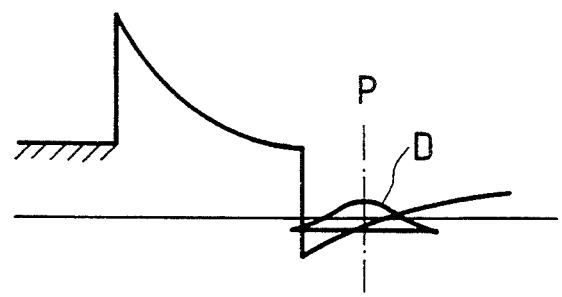

FIG. 1 shows a high electron mobility transistor according to an embodiment of the present invention, in which the same parts as in the conventional device of FIG. 6 are represented by the same reference numerals and redundant descriptions therefor are omitted here. The main feature of this embodiment resides in that a first high-resistivity semiconductor channel layer 9 and a second high-resistivity semiconductor channel layer 10 are provided between the undoped semiconductor layer 2 and the doped semiconductor layer 3. The electron affinity of the first high-resistivity semiconductor channel layer 9 gradually increases toward the undoped semiconductor layer 2, and that of the second high-resistivity semiconductor layer 10 gradually decreases toward the undoped semiconductor layer 2.

Figure 2:
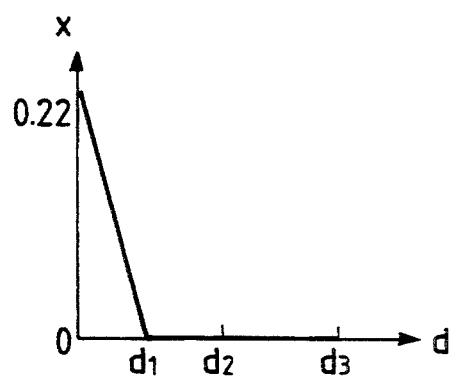
FIGS. 2 and 3 show a variation of the composition of first and second high-resistivity semiconductor layers.
Figure 3:
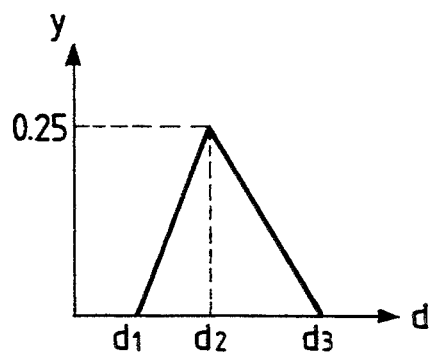

Each of the first and second high-resistivity semiconductor layers 9 and 10 has a composition of $Al_xIn_yGa_{1-x-y}As$, where x and y are determined, for example, as shown in FIGS. 2 and 3. In FIGS. 2 and 3, symbol d represents a position in the thickness direction of the first and second high-resistivity semiconductor channel layers 9 and 10, where d=0 corresponds to the interface with the doped semiconductor layer 3 and d=d3 corresponds to the interface with the undoped semiconductor layer 2.

Figure 5A:
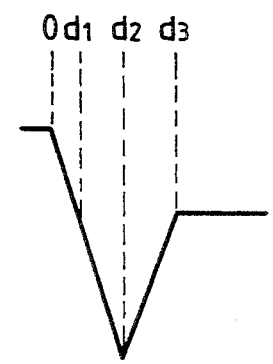
FIG. 5(a) is an enlarged energy band diagram of a part of FIG. 4(a)

The ordinate of FIG. 2 represents a mole ratio of aluminum, i.e., x, and the ordinate of FIG. 3 represents a mole ratio of indium, i.e., y. In the range of 0–d1, the composition takes a form of $Al_xGa_{1-x}As$. In the range of d1–d3, it takes a form of $In_yGa_{1-y}As$, where the mole ratio of indium, i.e., y, is maximum at a position d2. The position d2 corresponds to the interface between the first and second high-resistivity semiconductor channel layers 9 and 10. When added to GaAs, aluminum and indium serve to increase and decrease the potential, respectively. Therefore, as shown in an energy band diagram of FIG. 5(a), the position d2, where the mole ratio of indium is maximum, corresponds to the minimum position of a V-shaped portion.

Figure 4A:
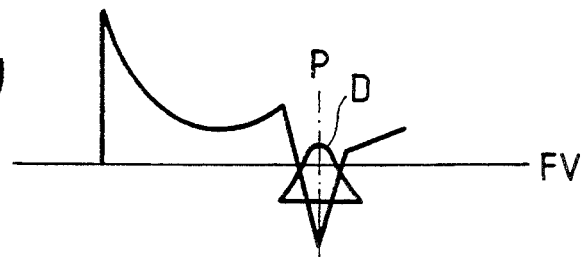
FIGS. 4(a) and 4(b) are energy band diagrams of the high electron mobility transistor according to the embodiment.
Figure 4B:
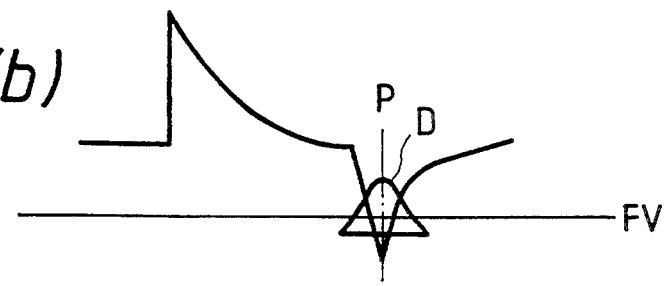

By providing the first and second high-resistivity semiconductor channel layers 9 and 10 in the above manner, the overall energy band takes a form as shown in FIGS. 4(a) when no voltage is applied to the gate electrode 4, and it becomes as shown in FIG. 4(b) when a negative voltage is applied. As is understood from FIGS. 4(a) and 4(b), the center of gravity P of the electron distribution D does not vary. As a result, when put into actual use, the device will have a superior electron controllability and low-noise characteristics.

Figure 5B:
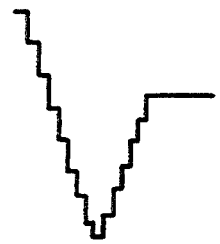
FIG. 5(b) is an energy band diagram of a part of a high electron mobility transistor according to a modification.

If it is difficult to produce the high-resistivity semiconductor channel layers 9 and 10 each having the continuous variation of the electron affinity, a generally V-shaped portion having a stepped variation may be provided as shown in FIG. 5(b). This is done by forming many layers having different compositions in each of the layers 9 and 10.

In FIG. 1, the other layers may have the following compositions: undoped semiconductor layer 2, GaAs; doped semiconductor layer 3, n+-type AlGaAs; and cap layers 5, n+-type GaAs.

According to the high electron mobility transistor having the above constitution, since the energy band structure in the electron accumulation layers assumes a generally symmetrical V shape, the center of gravity of the distribution of accumulated electrons does not move even if a negative voltage is applied to the gate electrode to raise the entire energy curve. As a result, the electron controllability and, therefore, noise characteristics can be improved. On the other hand, in the conventional device, the energy curve is steeper on the side of the doped semiconductor layer 3. Therefore, when the gate voltage is changed, it is considered that the energy curve varies only on the side of the substrate 1 and the center of gravity of the electron distribution is moved thereby.

What is claimed is:

1. A high electron mobility transistor comprising:
   an undoped compound semiconductor layer;
   a doped compound semiconductor layer having an electron affinity smaller than the undoped compound semiconductor layer;
   a gate electrode and a pair of cap layers formed on the doped compound semiconductor layer;
   source and drain electrodes formed on the pair of cap layers, respectively;
   a first high-resistivity compound semiconductor channel layer formed adjacent to the doped compound semiconductor layer and having an electron affinity distribution that increases toward the undoped compound semiconductor layer; and
   a second high-resistivity compound semiconductor channel layer formed between the first high-resistivity compound semiconductor channel layer and the undoped compound semiconductor layer and having an electron affinity distribution that decreases toward the undoped compound semiconductor layer,
   wherein the first and second high-resistivity compound semiconductor channel layers have a composition of $Al_xIn_yGa_{1-x-y}As$, where x monotonically decreases from a maximum at the boundary with the doped compound semiconductor layer in the direction toward the undoped compound semiconductor layer to a value of zero at a selected location within the first high-resistivity compound semiconductor channel layer, and y increases in the direction toward the second high-resistivity compound semiconductor channel layer from zero at the selected location within the first high-resistivity compound semiconductor layer to a maximum at the boundary between the first and second high-resistivity compound semiconductor channel layers and decreases in the direction from the boundary between the first and second high-resistivity compound semiconductor channel layers within the second high-resistivity compound semiconductor channel layer to zero at the boundary between that layer and the undoped compound semiconductor layer.

2. The high electron mobility transistor of claim 1, wherein the electron affinity distributions of the first and second high-resistivity compound semiconductor channel layers are step-like distributions.

* * * * *